United States Patent
Hanafi (10) Patent No.: US 7,791,941 B2
(45) Date of Patent: Sep. 7, 2010

(54) NON-VOLATILE SRAM CELL

(75) Inventor: Hussein I. Hanafi, Basking Ridge, NJ (US)

(73) Assignee: Micron Technology, Inc., Boise, ID (US)

( * ) Notice: Subject to any disclaimer, the term of this patent is extended or adjusted under 35 U.S.C. 154(b) by 249 days.

(21) Appl. No.: 11/924,801

(22) Filed: Oct. 26, 2007

(65) Prior Publication Data

US 2009/0109734 A1 Apr. 30, 2009

(51) Int. Cl.
G11C 11/34 (2006.01)
(52) U.S. Cl. .................. 365/185.08; 365/158; 365/171
(58) Field of Classification Search ............ 365/185.08, 365/158, 171, 173, 148, 63, 55, 185.05, 185.1, 365/185.26, 185.18
See application file for complete search history.

(56) References Cited

U.S. PATENT DOCUMENTS

| | | | |
|---|---|---|---|
| 6,781,874 B2 * | 8/2004 | Hidaka | ........................ 365/171 |
| 6,807,087 B2 | 10/2004 | Deak | |
| 6,870,714 B2 | 3/2005 | Drewes | |
| 6,903,396 B2 | 6/2005 | Tuttle | |
| 6,970,053 B2 | 11/2005 | Akram et al. | |
| 7,196,882 B2 | 3/2007 | Deak | |
| 7,264,844 B2 | 9/2007 | Drewes | |
| 7,269,685 B2 | 9/2007 | Swanson | |
| 2008/0084724 A1 * | 4/2008 | Nozieres et al. | ................ 365/50 |
| 2008/0113220 A1 * | 5/2008 | Sun et al. | ..................... 428/800 |
| 2008/0155186 A1 * | 6/2008 | Ashokkumar et al. | ........ 711/104 |

OTHER PUBLICATIONS

Berger, L. "Emission of spin waves by a magnetic multilayer traversed by a current," Physical Review B, vol. 54, No. 13, Oct. 1, 1996, pp. 9353-9358.
Clark, Lawrence T., et al. "Low Standby Power State Storage for Sub-130-nm Technologies," IEEE JSSC, vol. 40, No. 2, Feb. 2005, pp. 498-506.
Hosomi, M., et al. "A Novel Nonvolatile Memory with Spin Torque Transfer Magnetization Switching: Spin-RAM," IEDM Technical Digest Papers. (2005).
International Technology Roadmap for Semiconductors 2005, Process Integration, Devices & Structures, pp. 6-8. (2005).
Myers, E.B., et al. "Current-Induced Switching of Domains in Magnetic Multilayer Devices," Science, vol. 285, pp. 867-870. (1999).
Osada, Kenichi, et al. "16.7fA/cell Tunnel-Leakage-Suppressed 16 Mb SRAM for Handling Cosmic-Ray-Induced Multi-Errors," ISSCC Dig. Tech. Papers, Session 17, Paper 17.2. (2003).
Shigematsu, Satoshi, et al. "A 1-V High-Speed MTCMOS Circuit Scheme for Power-Down Application Circuits," IEEE JSSC, vol. 32, No. 6, Jun. 1997, pp. 861-869.

(Continued)

*Primary Examiner*—Dang T Nguyen
(74) *Attorney, Agent, or Firm*—Brooks, Cameron & Huebsch, PLLC (57) ABSTRACT

Methods, devices and systems for non-volatile static random access memory (SRAM) are provided. One method embodiment for operating an SRAM includes transferring data from a pair of static storage nodes of the SRAM to a pair of non-volatile storage nodes when the SRAM is placed in a standby mode. The method further includes transferring data from the pair of non-volatile storage nodes to the pair of static storage nodes when the SRAM exits the standby mode.

16 Claims, 8 Drawing Sheets

OTHER PUBLICATIONS

Slonczewski, J.C., "Current-driven excitation of magnetic multilayers," J. of Magn. Magn. Mater, vol. 159, pp. L1-L7. (1996).

Tehrani, Saied. "Status and Outlook of MRAM Technology (Invited)," IEDM Technical Digest Papers. (2006).

Tsoi, M., et al. "Excitation of a Magnetic Multilayer by an Electric Current," May 11, 2008, Physical Review Letters, vol. 80, No. 19, pp. 4281-4284.

Van Der Sluis, Paul. "Non-volatile memory cells based on ZnxCd1-xS ferroelectric Schottky diodes," Jun. 9, 2003, App. Phys. Lett., vol. 82, No. 23, pp. 4089-4091.

Zhang, Kevin, et al. "SRAM design on 65-nm CMOS Technology with dynamic sleep transistor for leakage reduction," IEEE JSSC, vol. 40, No. 4, Apr. 2005, pp. 895-901.

* cited by examiner

NON-VOLATILE SRAM CELL

TECHNICAL FIELD

The present disclosure relates generally to semiconductor devices and, more particularly, to non-volatile static random access memory (SRAM).

BACKGROUND

Static Random Access Memory (SRAM) arrays occupy a large fraction of the chip area in many of today's memory designs. As memory will continue to consume a large fraction of many future designs, scaling of memory density involves continuing to track the scaling trends of logic. With aggressive scaling of metal oxide semiconductor field effect transistors (MOSFETs), leakage currents are increasing with each circuit node.

These leakage currents consume a significant amount of power. One approach to reduce leakage currents MOSFET circuitry includes powering down portions of the MOSFET chip circuitry when not in use. However, this approach cannot be applied in certain memory arrays, e.g., an SRAM array, without losing the stored contents of the memory.

DETAILED DESCRIPTION

Methods, devices and systems for a non-volatile static random access memory (SRAM) are provided. One method embodiment for operating the SRAM includes transferring data from a pair of static storage nodes of the SRAM to a pair of non-volatile storage nodes when the SRAM is placed in a standby mode. The method further includes transferring data from the pair of non-volatile storage nodes to the pair of static storage nodes when the SRAM exits the standby mode.

In one or more embodiments, an SRAM includes a cross coupled pair of inverters. Each inverter includes a p-type pull up transistor and an n-type pull down transistor coupled to a first storage node, wherein gates of each inverter in the pair are coupled to the first storage node of the other inverter. Each inverter in the SRAM includes a second storage node coupled to the first storage node. In one or more embodiments the first storage node is a static storage node and the second storage node is a non-volatile storage node. In one or more embodiments, the second storage node comprises a two terminal magnetic tunnel junction (MTJ) device, wherein the MJT device includes a first ferromagnetic layer and a second ferromagnetic layer separate by a dielectric. In one or more embodiments the first ferromagnetic layer is coupled to the first storage node and is unpinned such that a polarization of an associated spin value can rotate. The second ferromagnetic layer is in contact with an anti-ferromagnetic layer coupled to a control line and is pinned such that a polarization of an associated spin value is fixed in one direction.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
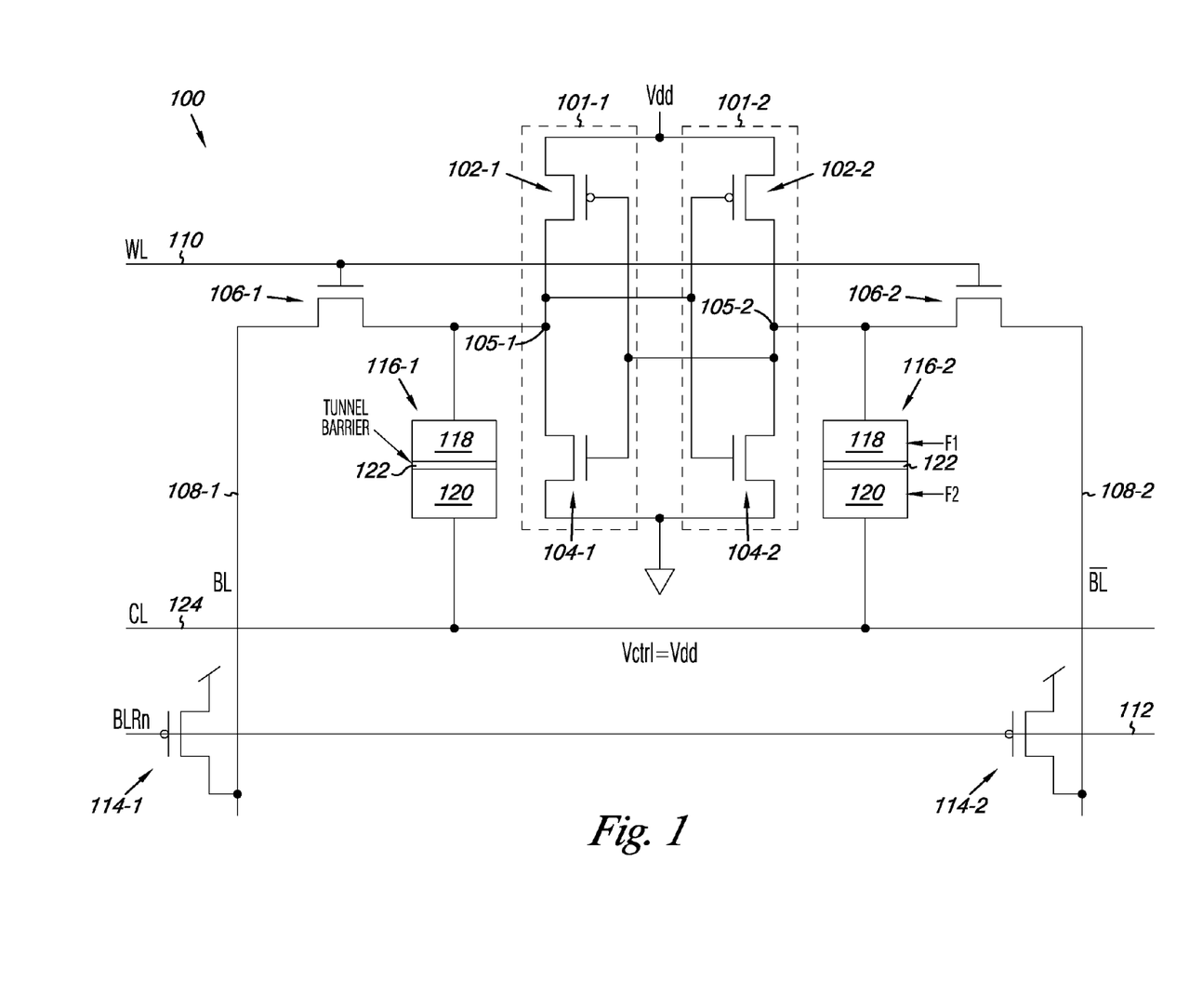
FIG. 1 illustrates a six transistor (6-T) SRAM cell design including a first pair of storage nodes coupled to a second pair of storage nodes according to an embodiment of the present invention.

FIG. 1 illustrates a six transistor (6-T) SRAM cell 100 including a first pair of storage nodes 105-1 and 105-2, e.g., static storage nodes, coupled to a second pair of storage nodes 116-1 and 116-2, e.g., non-volatile storage nodes, according to an embodiment of the present invention. The SRAM 100 embodiment of FIG. 1 includes a first inverter 101-1 including a p-channel (PMOS) pull up transistor (Tpu) 102-1 and an n-channel (NMOS) pull down transistor (Tpd) 104-1 coupled at one of the pair of first storage nodes, e.g., 105-1, formed between their drain regions. The storage node 105-1 is further coupled to a drain region of an n-channel (NMOS) pass gate transistor (Tpg) 106-1. The source region of the Tpg 106-1 is coupled to a sense line 108-1, e.g., bit line, here referred to as bit line (BL).

The SRAM cell 100 includes a second inverter 101-2 including a p-channel (PMOS) pull up transistor (Tpu) 102-2 and an n-channel (NMOS) pull down transistor (Tpd) 104-2 coupled at the other of the pair of first storage nodes, e.g., 105-2, formed between their drain regions. The storage node 105-2 is further coupled to a drain region of an n-channel (NMOS) pass gate transistor (Tpg) 106-2. The source region of the Tpg 106-2 is coupled to another sense line 108-2, e.g., bit line, here referred to as bit line bar (BL BAR).

As shown in the embodiment of FIG. 1, the first and the second inverter, 101-1 and 101-2, are cross coupled such that the one of the pair of first storage nodes, e.g., 105-1, of the first inverter 101-1 is coupled to the gates of Tpu 102-2 and Tpd 104-2 and the other of the pair of first storage nodes, e.g., 105-2 of the second inverter 101-2 is coupled to the gates of Tpu 102-1 and Tpd 104-1. Each inverter, 101-1 and 101-2, is coupled between a power supply node, e.g., Vdd, and ground. Hence, as the reader will appreciate, the cross coupled nature of the inverters, 101-1 and 101-2, is intended to function such that a charge stored on one of the pair of first storage nodes, e.g., 105-1, will be different to that stored on the other of the pair of first storage nodes, e.g., 105-2.

The gates of the pass gate transistors, Tpg 106-1 and 106-2, are coupled to a select line 110, e.g., word line (WL). Operation on the pair of first storage nodes 105-1 and 105-2 is controlled by using the select line 110 to turn "on" the Tpgs, 106-1 and 106-2, and via a potential applied to BL 108-1 and BL BAR 108-2. BL 108-1 and BL BAR 108-2 are accessed depending on the signal applied to the respective sense line 108-1 and 108-2, e.g., bit line, via a row enable line 112 (BLRn). That is, the BLRn 112 can place an appropriate potential on BL 108-1 and BL BAR 108-2 by activating respective transistors 114-1 and 114-2.

In normal, e.g., powered up/non-standby, SRAM operation, a "state" on storage node 105-2, e.g., a charge representing a data state ("1" or a "0"), which is associated with BL BAR 108-2 in this example, may be read by pre-charging both BL 108-1 and BL BAR 108-2 to some potential, e.g., Vcc/2. A potential is then applied to the select line 110, e.g. WL, in order to activate, e.g., turn "on", the pass gate transistors, Tpg 106-1 and 106-2, and read the state on storage node 105-2 in the SRAM cell 100.

In normal, e.g., powered up/non-standby, SRAM operation, a "state", e.g., a charge representing a data state ("1"), can be written to storage node 105-2, associated with BL BAR 108-2 in this example, by grounding BL 108-1 and charging BL BAR 108-2 by raising BL BAR 108-2 to some elevated potential, e.g., Vcc. A potential is then applied to the select line 110, e.g. WL, in order to activate, e.g., turn "on", the pass gate transistors, Tpg 106-1 and 106-2 and write data, e.g., a logic "1" to storage node 105-2 in the SRAM cell 100.

As shown in the embodiment of FIG. 1, each inverter 101-1 and 101-2 includes a second pair of storage nodes 116-1 and 116-2 coupled to a respective one of the first pair of storage nodes 105-1 and 105-2. The first storage nodes 105-1 and 105-2 are static storage nodes and the second storage nodes 116-1 and 116-2 are non-volatile storage nodes. In one or more embodiments a two terminal magnetic tunnel junction (MTJ) device (described further in FIG. 2A) serves as the second storage nodes 116-1 and 116-2. As the reader will appreciate an MTJ device is also sometimes referred to as a tunneling magneto-resistive (TMR) device.

Each MTJ 116-1 and 116-2 comprises a first ferromagnetic layer 118 and a second ferromagnetic layer 120 separated by a dielectric 122. The first ferromagnetic layer 118 is electrically connected to a respective one of the first storage nodes 105-1 and 105-2. The second ferromagnetic layer 120 is in contact with an anti-ferromagnetic layer (shown as 223 in FIG. 2A) which is electrically connected to a control line (CL) 124.

As one of ordinary skill in the art will appreciate upon reading this disclosure, a number of SRAM cells, such as SRAM cell 100 in FIG. 1, can be formed in an array. Each SRAM cell in the array can include a complementary pair of sense lines, e.g. bit line (BL) 108-1 and bit line bar (BL BAR) 108-2, coupled to respective first storage nodes, e.g., static storage nodes 105-1 and 105-2 in FIG. 1. As such, connecting the control line 124 to the pair of second storage nodes 116-1 and 116-2 can include connecting the control line 124 to pairs of second storage nodes in a block of SRAM cells. Additionally, one of ordinary skill in the art will appreciate that the structure schematically illustrated in the embodiment of FIG. 1 can be formed according to semiconductor fabrication techniques to form the pair of second storage nodes 116-1 and 116-2 above a layer in which the first storage nodes 105-1 and 105-2 of the SRAM 100 are formed to conserve SRAM cell area.

Figure 2A:
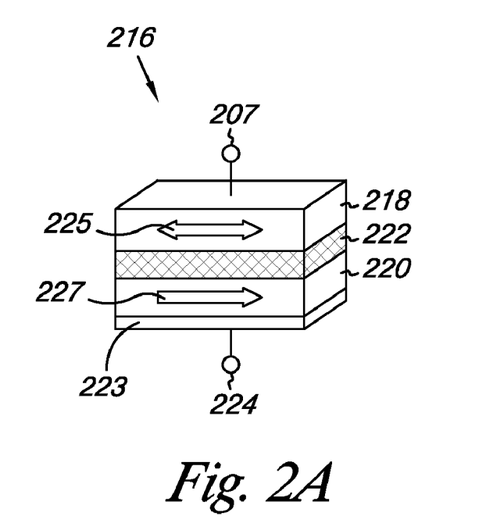
FIG. 2A illustrates an example magnetic tunnel junction (MJT) device that can be implemented as the second pair of storage nodes in FIG. 1 according to one or more embodiments of the present invention.

FIG. 2A illustrates an example magnetic tunnel junction (MJT) device 216 that can be implemented as the second pair of storage nodes 116-1 and 116-2 in FIG. 1 according to one or more embodiments of the present invention. As shown in FIG. 2A, the MTJ device 216 comprises a first ferromagnetic layer 218 and a second ferromagnetic layer 220 separate by a dielectric 222. By way of example, and not by way of limitation, materials that can be used to provide the first and the second ferromagnetic layers 218 and 220 include Iron (Fe), Copper (Cu), and Nickel (Ni). The dielectric 222 can be a thin, e.g., approximately 10 Angstrom thick, oxide layer formed from silicon-dioxide ($SiO_2$), magnesium-oxide (MgO), or other suitable dielectric.

As mentioned in connection with the embodiment of FIG. 1, the first ferromagnetic layer 218 can be connected to a respective one of the pair of first storage nodes in the cross coupled inventers in the SRAM, e.g., 105-1 and 105-2 in FIG. 1. The first ferromagnetic layer 218 is unpinned, e.g., "free", such that a polarization of an associated spin value can rotate as reflected by the bidirectional arrow 225. The second ferromagnetic layer 220, however, is in contact with a layer of anti-ferromagnetic material 223. By way of example, and not by way of limitation, materials that can be used to provide the anti-ferromagnetic layer 223 include alloys such as Iron-Manganese (FeMn), Iridium-Manganese (IrMn), and Platinum-Manganese (PtMn). This contact between the second ferromagnetic layer 220 and the anti-ferromagnetic layer 223 pins, e.g., "fixes", the second ferromagnetic layer 220 to prevent a polarization of an associated spin value from rotating as reflected by the unidirectional arrow 227 (e.g., fixed in one direction).

Figure 2B:
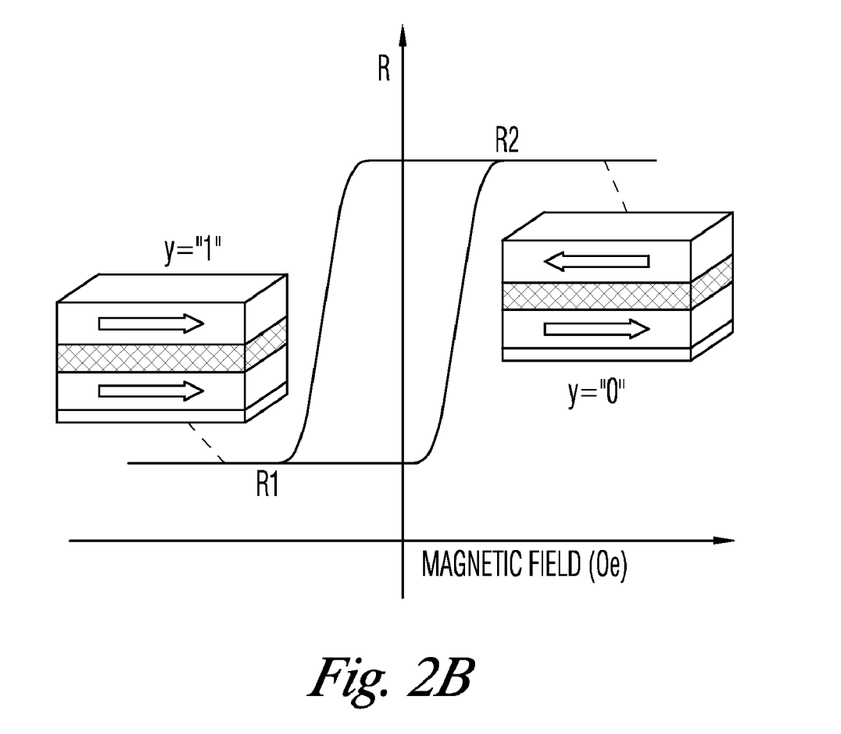
FIG. 2B illustrates a graph of resistance versus magnetic field representing a first and a second resistance according to spin value states in the MTJ embodiment of FIG. 2A.

FIG. 2B illustrates a graph of resistance versus magnetic field representing a first and a second resistance, e.g., R1 and R2, respectively, according to spin value states in the MTJ embodiment of FIG. 2A. According to states of two spin values 225 and 227 in each ferromagnetic layer 218 and 220, e.g., parallel or anti-parallel, resistance of the MTJ device 216 can be changed based on spin torque transfer magnetization switching. That is, the MTJ device 216 can be programmed by magnetization reversal through an interaction of a spin momentum torque current and the magnetic moments in the first and second ferromagnetic layers 218 and 220. When a current pulse is passed through the MTJ device 216 a torque is applied on the first, e.g., "free", ferromagnetic layer's 218 magnetic moment due to the angular momentum carried by the spin polarized tunneling current. If the pulse current-density is large enough the free ferromagnetic layer 218 will switch magnetic states. Hence, when a sufficiently negative potential is applied between the two terminals 207 and 224 of the MTJ device 216 the magnetization of the first and the second ferromagnetic layers 218 and 220 transform from parallel to anti-parallel, switching the MTJ device 216 into a highest resistance level state, e.g., OFF state. Conversely, when a sufficiently low potential, e.g., ground, is applied the magnetization of the first and the second ferromagnetic layers 218 and 220 transform from anti-parallel to parallel, switching the MTJ device 216 into a lowest resistance level state, e.g., ON state.

As shown in FIG. 2B, when the spin values 225 and 227 are parallel the MTJ device 216 will exhibit a lowest resistance value to current flow for a potential established between the device's 216 two terminals, e.g., 207 and 224. For description purposes herein, when the spin values 225 and 227 are parallel (or substantially aligned) the MTJ device 216 is referred to as storing data associated with a logic value "1". By contrast, when the when the spin values 225 and 227 are anti-parallel the MTJ device 216 will exhibit a highest resistance value to current flow when a potential is established between the device's 216 two terminals, e.g., 207 and 224. For description purposes herein, when the spin values 225 and 227 are anti-parallel the MTJ device 216 is referred to as storing data associated with a logic value "0". As such, the MTJ device 216 can be regarded as a variable resistor, e.g., can alternate between a first and a second resistance, and provides a non-volatile storage capability.

FIGS. 3A-3D illustrate an operational embodiment according to one embodiment of the present invention. FIGS. 3A-3D follow the numbering convention of FIGS. 1 and 2 where the first digit of a reference number refers to the Figure in which it is used, while the remaining two digits of the reference number refer to the same or equivalent parts of embodiment(s) of the present disclosure used in FIGS. 1 and 2. FIGS. 3A-3D illustrate a non-volatile SRAM 300 having a structural embodiment analogous to that described in connection with FIG. 1. The operational embodiments described in connection with FIGS. 3A-3D discuss four modes of operation, e.g., NORMAL, STORE, RESTORE, and RESET, for the non-volatile SRAM 300. The example embodiment described in connection with FIGS. 3A-3D involve a scenario in which the non-volatile SRAM 300 has been operating in a powered up/non-standby manner and that data representing a logic "1" value is stored on storage node 305-2 of the pair of first storage nodes (right hand side of the drawing) and that data representing a logic "0" value is stored on storage node 305-1 of the pair of first storage nodes (left hand side of the drawing).

Figure 3A:
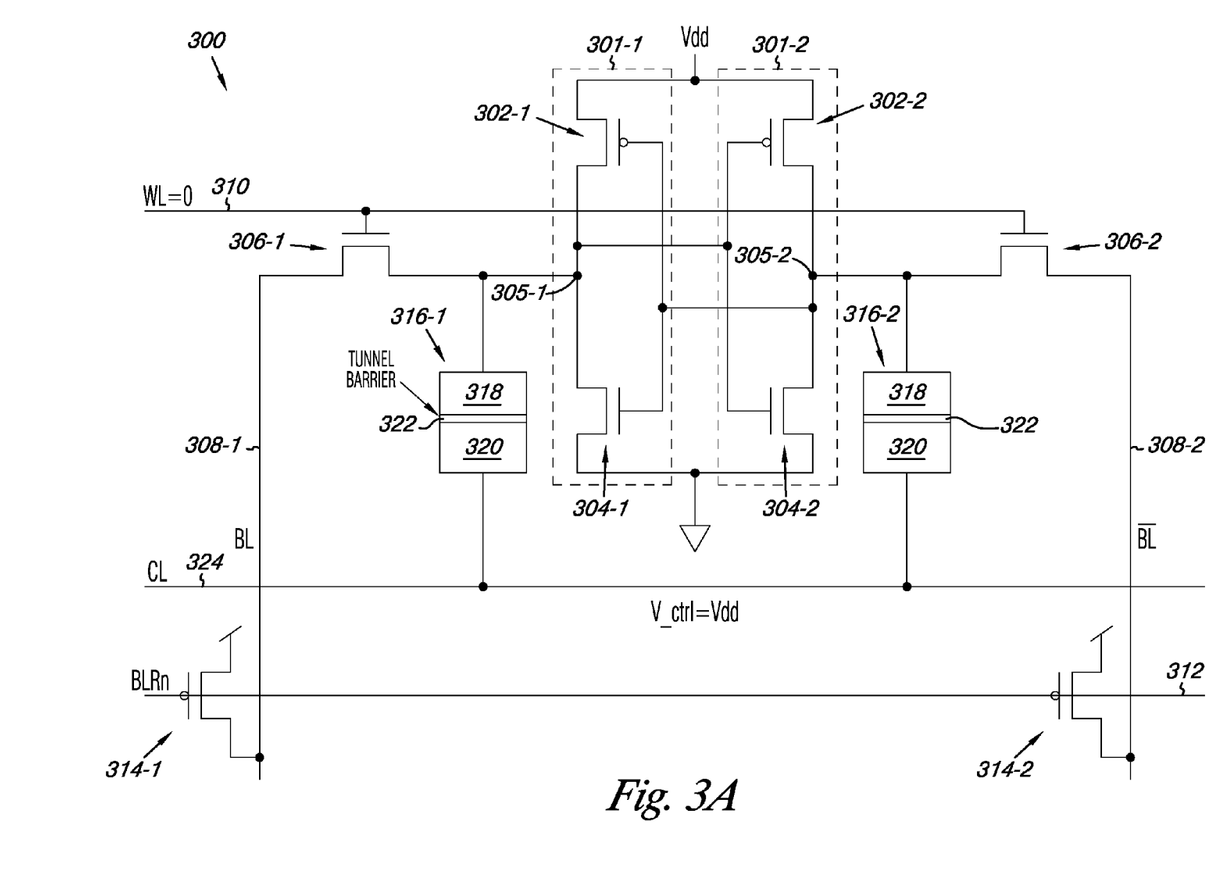
FIGS. 3A-3D illustrate an operational embodiment according to one embodiment of the present invention.

In NORMAL powered on/non-standby mode of the SRAM 300, as shown in FIG. 3A, a first potential, e.g., first positive potential (Vdd), is applied to the control line 324. As mentioned above in connection with FIG. 2B, when a sufficiently negative potential is applied between the two terminals, e.g., 318 and 320, of the MTJ devices 316-1 and 316-2 the magnetization of the first and the second ferromagnetic layers 318 and 320 transform from parallel to anti-parallel, switching the MTJ devices 316-1 and 316-2 into a highest resistance level state, e.g., OFF state. Applying the first potential, e.g., first positive potential (Vdd), to the control line 324, the MTJ devices 316-1 and 316-2 can be maintained in an "OFF" state, e.g., high resistance state R2 as shown in FIG. 2B, while the SRAM 300 is being operated, read from and written to, in the NORMAL powered on/non-standby mode. That is, the MTJ devices 316-1 and 316-2 will not conduct as the spin values associated with the first and the second ferromagnetic layers, 318 and 320, of the second storage nodes, 316-1 and 316-2, are anti-parallel and the NORMAL operation of the SRAM 300 is not affected.

Figure 3B:
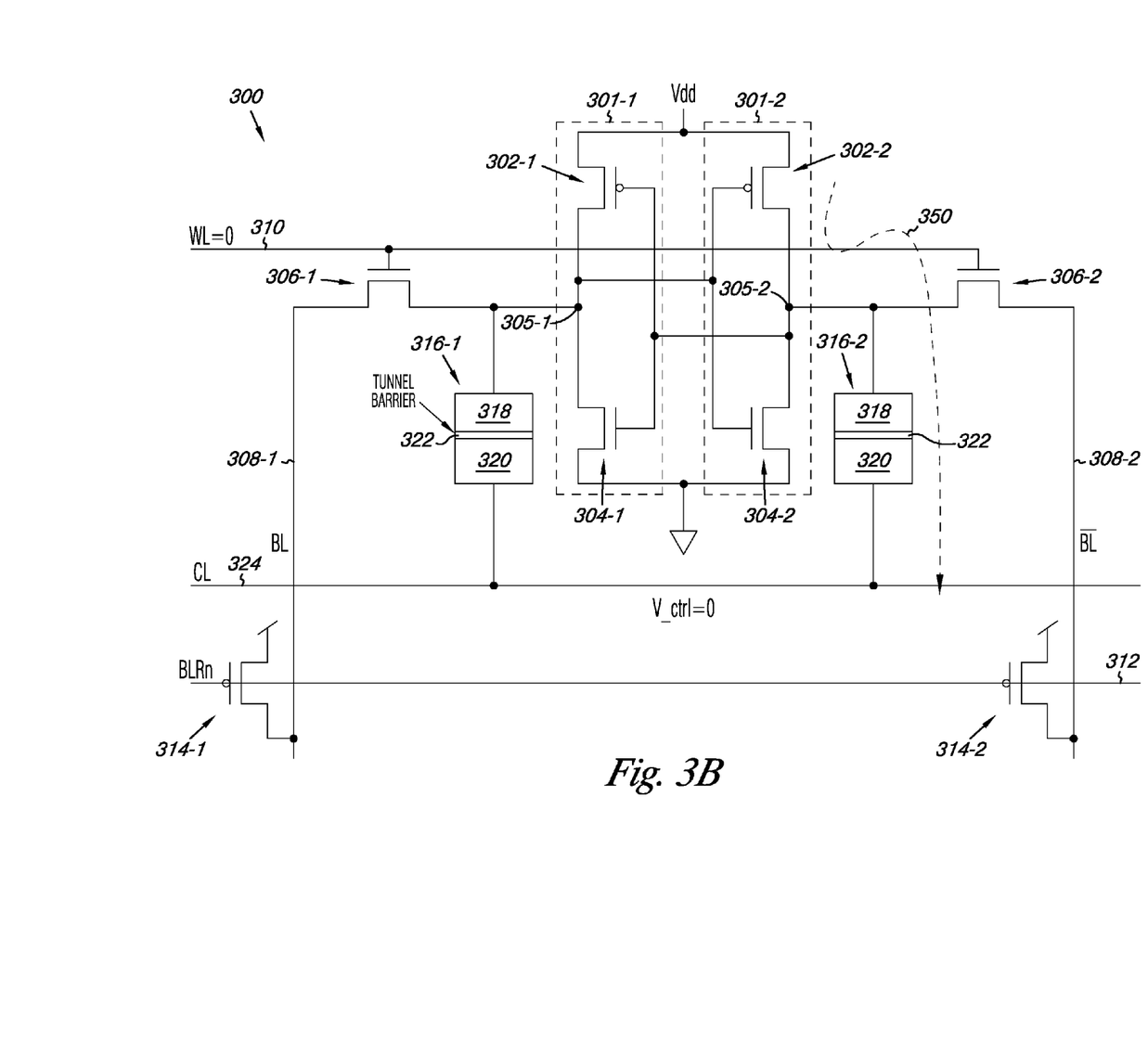

In the operational embodiment of FIG. 3B a STORE operation is performed to transfer data from a pair of static storage nodes 305-1 and 305-2 of the SRAM 300 to a pair of non-volatile storage nodes 316-1 and 316-2 in order to power down the SRAM 300, e.g., place the SRAM 300 in a standby mode. To do so, the select line 310 for the SRAM 300 is turned off, e.g., WL is grounded so that Tpgs 306-1 and 306-2 are not activated. A potential applied to the control line (CL) 324 is changed from a first potential, e.g., a first positive potential (Vdd), to a second potential, e.g., ground. In this example embodiment, because a low logic value, e.g., "0", is stored on first storage node 305-1 a low potential will be applied to p-type Tpu 302-2 such that Tpu 302-2 is turned on and conducts. Hence, grounding control line 324 will create a current flow, shown by arrow 352 between a power supply potential, e.g., Vdd, coupled to the pull up transistor Tpu 302-2 in the cross coupled pair of inverters 301-1 and 301-2, and the grounded control line 324.

As mentioned above in connection with FIGS. 2A and 2B, when a tunneling current is passed through the dielectric 322 between the first ferromagnetic layer 318 and the second ferromagnetic layer 320 of the MTJ device 316-2 a torque operates on the first, e.g., "free", ferromagnetic layer's 318 magnetic moment due to the angular momentum carried by the spin polarized tunneling current. If the pulse current-density is large enough the free ferromagnetic layer 318 will switch magnetic states. Hence, when a sufficiently high potential is applied between the two terminals 318 and 320 of the MTJ device 316-2 the magnetization of the first and the second ferromagnetic layers 318 and 320 transform from anti-parallel to parallel, switching the MTJ device 316 into a lowest resistance level state, e.g., programmed to an "ON" state. Thus, the logic "1" value on first, e.g., static, storage node 305-1 will be transferred to second, e.g., non-volatile, storage node 316-2 through the Tpu 302-2.

On the other side of the cell, because a high logic value, e.g., "1", is stored on first storage node 305-2 a high potential will be applied to p-type Tpu 302-1 such that Tpu 302-1 is turned off and does not conduct. Hence, grounding control line 324 does not create a current flow through MTJ device 316-1 and MTJ 316-1 remains in an "OFF" state. By performing the STORE operation, logic states on the first storage nodes 305-1 and 305-2 are "remembered" as "ON/OFF" resistances of the non-volatile MTJ devices 316-1 and 316-2. The SRAM can then by powered down, e.g., power supply Vdd removed from the cross coupled inverters 301-1 and 301-2, without losing its memory data, e.g., stored logic state information. Next, as shown in FIG. 3C, when the SRAM cell exits standby, the previous logic states are recalled, e.g., transferred from the second storage nodes, 316-1 and 316-2, back to the first storage nodes, 305-1 and 305-2, to return the SRAM 300 to NORMAL operation.

Figure 3C:
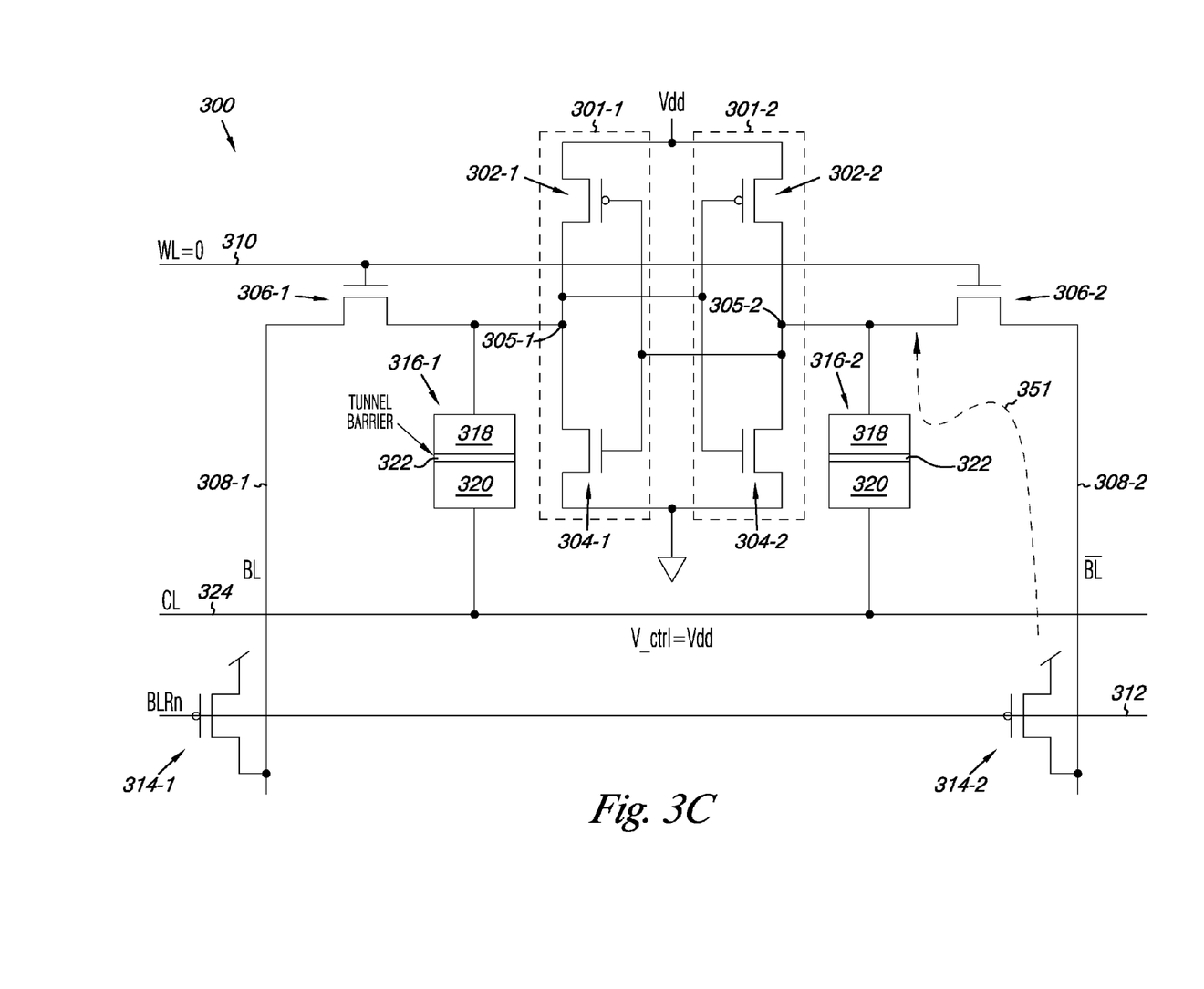

In the operational embodiment of FIG. 3C a RESTORE operation is performed to transfer data from a pair of non-volatile storage nodes 316-1 and 316-2 of the SRAM 300 to a pair of static storage nodes 305-1 and 305-2 in order to return the logic values from the pair of non-volatile storage nodes 316-1 and 316-2 to the pair of static storage nodes 305-1 and 305-2 for NORMAL operation of the SRAM 300. To do so, a potential applied to the control line 324 is raised to the first potential, e.g., first positive potential (Vdd), before powering up the SRAM 300. The resistances of the two MTJ devices 316-1 and 316-2 are at this point asymmetrical. That is, MTJ 316-2 has a first, e.g., lower, resistance state due to parallel spin values in the first and the second ferromagnetic layers 318 and 320 and MTJ 316-1 has a second, e.g., higher, resistance state due to anti-parallel spin values in the first and the second ferromagnetic layers 318 and 320. Due to asymmetry of the resistances of the two MTJ devices 316-1 and 316-2, the first storage node 305-2 connected with the "ON" MTJ device 316-2 is charged faster than the first storage node 305-1 connected with the "OFF" MTJ device 316-1. This charging of first storage node 305-2 is reflected by current flow arrow 351 in FIG. 3C. Thus, upon applying a power supply, e.g., Vdd, to the cross coupled inverters, 301-1 and 301-2, of the SRAM 300, the logic "1" value that was stored on the second, non-volatile, storage node 316-2 is restored to the first storage node 305-2 and logic "0" value that was stored on the second, non-volatile, storage node 316-1 is restored to the first storage node 305-1, which are the same logic states remembered in the STORE operation.

Figure 3D:
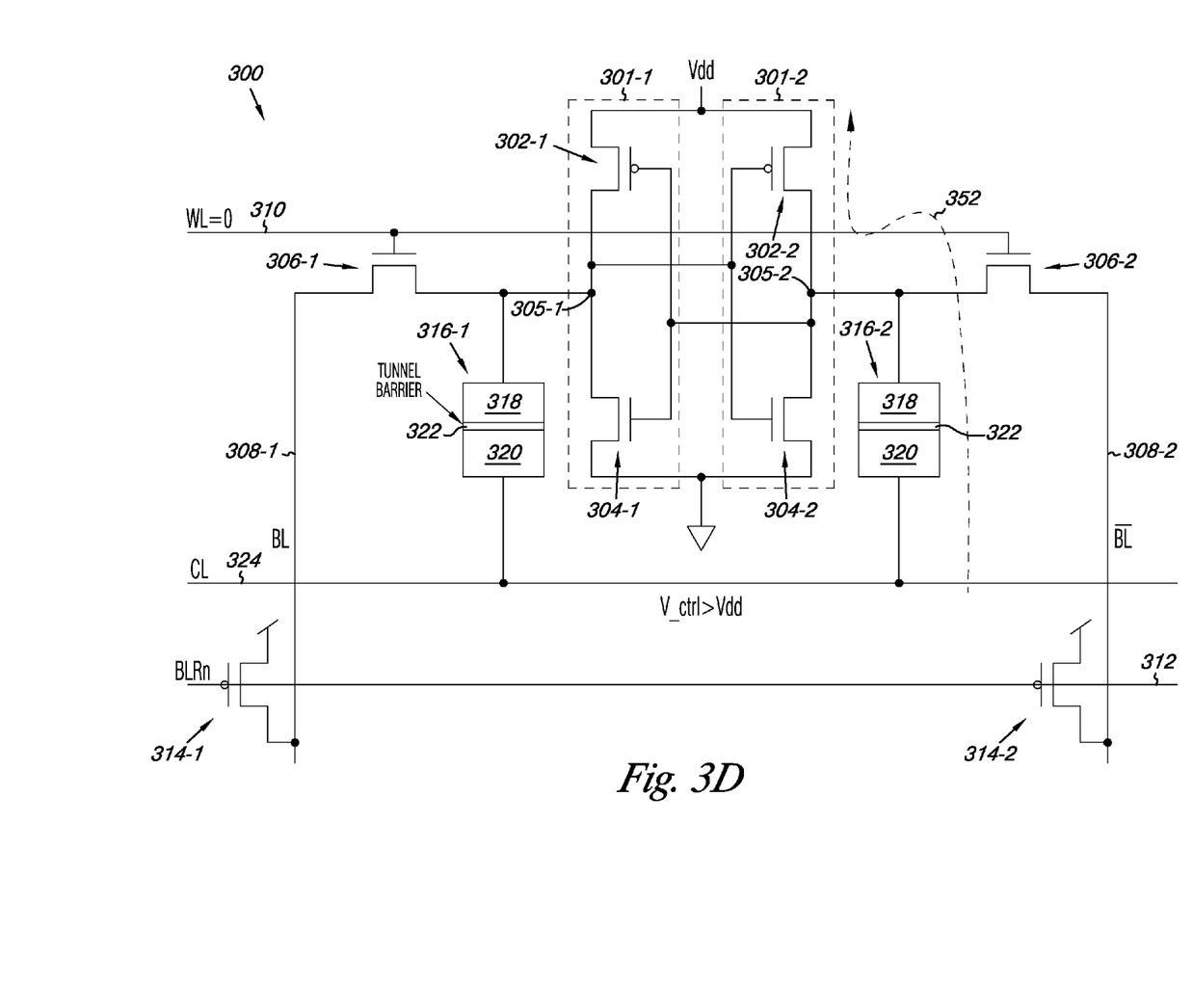

In the operational embodiment of FIG. 3D a RESET operation is performed in order to return the SRAM 300 to NORMAL operation. As shown in the embodiment of FIG. 3D, a second potential, e.g., second positive potential (boosted "Vdd"), is applied to the control line 324. This action turns off the "ON" state of the second storages nodes 316-1 and 316-2 since, as explained in connection with FIG. 2B, when a sufficiently negative potential is applied between the two terminals, e.g., 318 and 320, of the MTJ devices 316-1 and 316-2 the magnetization of the first and the second ferromagnetic layers 318 and 320 transform from parallel to anti-parallel, switching the MTJ devices 316-1 and 316-2 into a highest resistance level state, e.g., OFF state. This is shown in FIG. 3D by current flow arrow 352 passing through MTJ 316-2 such that a torque is applied on the first, e.g., "free", ferromagnetic layer's 318 magnetic moment due to the angular momentum carried by the spin polarized tunneling current and switching the magnetization of the first and the second ferromagnetic layers 318 and 320 from parallel to anti-parallel.

With the pair of second storage nodes 316-1 and 316-2 now in the "OFF" state, the first potential, e.g., first positive potential (Vdd), can once again be applied to the control line 324 to resume NORMAL operation.

Figure 4:
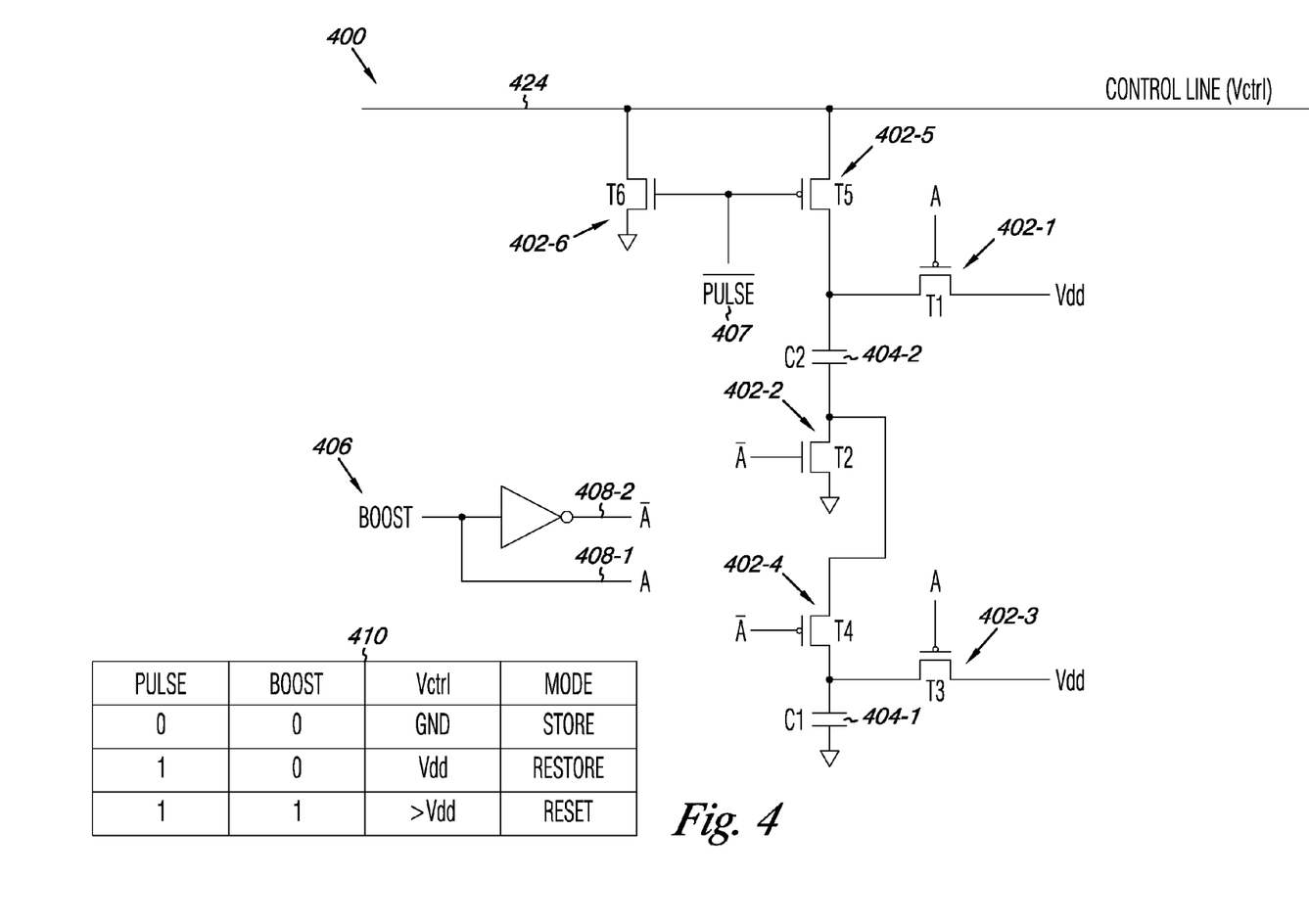
FIG. 4 illustrates an embodiment for a control circuit associated with a control line according to an embodiment of the present invention.

FIG. 4 illustrates an embodiment for a control circuit 400 associated with a control line 424, e.g., control line 324 in FIGS. 3A-3D, according to an embodiment of the present invention. The circuit 400 embodiment shown in FIG. 4 includes six (6) transistors, e.g., metal oxide semiconductor field effect transistors (MOSFETs) 402-1 (T1), 402-2 (T2), 402-3 (T3), 402-4 (T4), 402-5 (T5), and 402-6 (T6), and two capacitors 404-1 (C1) and 404-2 (C2). In this embodiment, transistors 402-2 and 402-6 (T2 and T6) are n-channel MOSFETs (NMOS transistors) and transistors 402-1 (T1), 402-3 (T3), 402-4 (T4), 402-5 (T5) are p-channel MOSFETs (PMOS transistors).

The logic signal BOOST 406 determines the gate inputs A provided to PMOS 402-1 (T1) and PMOS 402-3 (T3) and A BAR gate inputs provided to NMOS 402-2 (T2) and PMOS 402-4 (T4). As shown in the embodiment of FIG. 4, the gate input A, provided on signal line 408-1 to transistors T1 and T3, is the same as the BOOST signal 406, while the gate input A BAR, provided on signal line 408-2 to the transistors T2 and T4, is the invert of the BOOST signal 406.

A PULSE BAR logic signal 407 is provided to the gate inputs of PMOS 402-5 (T5) and NMOS 402-6 (T6). NMOS transistor 402-6 (T6) is coupled between the control line 424 and ground. PMOS transistor 402-5 (T5) is coupled at its drain to control line 424 and at its source to the rest of control circuit 400 associated with the control line 424. When the PULSE BAR signal 407 is high, e.g., at first positive potential (Vdd), PMOS transistor 402-5 (T5) is "OFF" and NMOS transistor 402-6 (T6) is "ON" grounding the control line 424. When the PULSE BAR signal 407 is low, e.g., grounded, NMOS transistor 402-6 (T6) is "OFF" and PMOS transistor 402-5 (T5) is "ON". Therefore, the potential applied to the control line 424 is determined by the BOOST signal 406.

As reflected by logic table 410, when a BOOST signal 406 and the PULSE signal are both low, e.g., logic "0", then PULSE BAR signal 407 is high, e.g., at first positive potential (Vdd), PMOS transistor 402-5 (T5) is "OFF" and NMOS transistor 402-6 (T6) is "ON" grounding the control line 424, e.g., applying a "first potential" to the control line 424. As explained in connection with FIG. 3B, this action equates to the STORE mode such that data is transferred from the first, e.g., static, storage nodes, 305-1 and 305-2 in FIG. 3B, to the second, non-volatile, storage nodes, 316-1 and 316-2 in FIG. 3B, of the SRAM when the SRAM is to be powered down or enter standby.

When a PULSE signal is high, e.g., logic "1", then the PULSE BAR signal applied to NMOS transistor 402-6 (T6) and PMOS transistor 402-5 (T5) is low turning "OFF" NMOS 402-6 (T6) and turning "ON" PMOS 402-5 (T5. When the BOOST signal level 406 is low, e.g., logic "0", PMOS transistors 402-1 (T1) and 402-3 (T3), having gate inputs A, and NMOS transistor 402-2 (T2), having gate input A BAR, are "ON" and conduct current, while PMOS transistor 402-4 (T4) is "OFF" and does not conduct current. In this example embodiment, capacitors 404-1 (C1) and 404-2 (C2), coupled between Vdd and ground through PMOS 402-1 (T1) and PMOS 402-3 (T3), are charged to full power supply potential, e.g., Vdd, and the potential applied to control line 424 rises to Vdd, e.g., applying a second potential to the control line 424. As explained in connection FIG. 3B, this action equates to the RESTORE mode such that data is transferred from the second, non-volatile, storage nodes, 316-1 and 316-2 in FIG. 3B, to the first, e.g., static, storage nodes, 305-1 and 305-2 in FIG. 3B, of the SRAM before the SRAM is powered up or exits standby.

As noted above, the control circuit 400 can also be operated in this manner during the NORMAL operation mode of the SRAM. Alternatively, as one of ordinary skill in the art will appreciate upon reading this disclosure, the control line 424 could also be floated (not shown in FIG. 4) during the NORMAL operation mode in order to maintain the second, non-volatile, storage nodes, 316-1 and 316-2 in FIGS. 3A-3D, in a higher resistance, e.g., "OFF", state such that the powered-up/non-standby read and write operations of the SRAM are not affected.

When a PULSE signal is high, e.g., logic "1", then the PULSE BAR signal applied to NMOS transistor 402-6 (T6) and PMOS transistor 402-5 (T5) is low turning "OFF" NMOS 402-6 (T6) and turning "ON" PMOS 402-5 (T5. When the BOOST signal level 406 is high, e.g., logic "1", PMOS transistors 402-1 (T1) and 402-3 (T3), having gate inputs A, and NMOS transistor 402-2 (T2), having gate input A BAR, are "OFF" and do not conduct current, while PMOS transistor 402-4 (T4) is "ON" and does conduct current. This action can be taken in sequence following the RESTORE operation such that capacitors 404-1 (C1) and 404-2 (C2), are now connected in series boosting the potential applied to the control line 424 to an elevated potential, e.g., >Vdd, in effect applying a third potential to the control line 424.

As explained in connection FIG. 3C, this action equates to the RESET mode and supplies a sufficiently high current density pulse through the second storage nodes, e.g., 316-1 and 316-2 in FIGS. 3A-3D, such that the magnetization of the first and the second ferromagnetic layers, e.g., 318 and 320 in FIGS. 3A-3D, transform from parallel to anti-parallel, switching the second storage nodes into a highest resistance level state, e.g., OFF state, such that the powered-up/non-standby read and write operations of the SRAM are not affected once the SRAM is powered up or exits standby.

Figure 5:
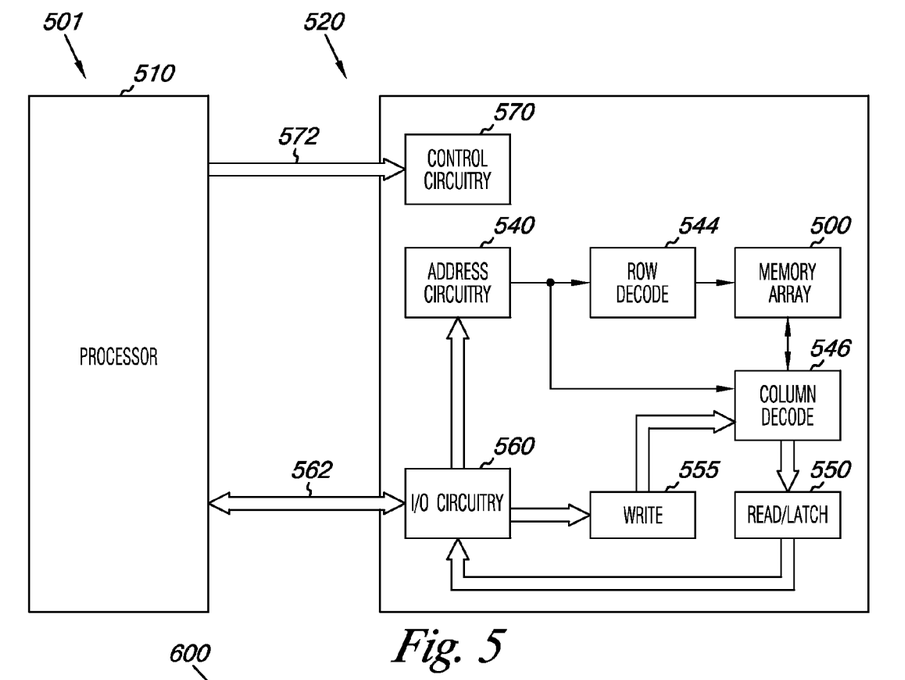
FIG. 5 is a functional block diagram of an electronic memory system having at least one memory device in accordance with an embodiment of the present disclosure.

FIG. 5 is a functional block diagram of an electronic memory system 501 including at least one memory device 520 including a non-volatile SRAM in accordance with an embodiment of the present disclosure. Memory system 501 includes a processor 510 coupled to a memory device 520 that includes a memory array 500 of memory cells. The memory device 520 can include an array 500 of back gated SRAM cells which can be formed and operated according to one or more embodiments described herein.

The memory system 501 can include separate integrated circuits or both the processor 510 and the memory device 520 can be on the same integrated circuit. The processor 510 can be a microprocessor or some other type of controlling circuitry such as an application-specific integrated circuit (ASIC).

The embodiment of FIG. 5 includes address circuitry 540 to latch address signals provided over I/O connections 562 through I/O circuitry 560. Address signals are received and decoded by a row decoder 544 and a column decoder 546 to access the memory array 500. In light of the present disclosure, it will be appreciated by those skilled in the art that the number of address input connections depends on the density and architecture of the memory array 500 and that the number of addresses increases with both increased numbers of memory cells and increased numbers of memory blocks and arrays.

The memory device 520 reads data in the memory array 500 by sensing voltage and/or current changes in the memory array columns using sense/buffer circuitry that in this embodiment can be read/latch circuitry 550. The read/latch circuitry 550 can read and latch a page or row of data from the memory array 500. I/O circuitry 560 is included for bi-directional data communication over the I/O connections 562 with the processor 510. Write circuitry 555 is included to write data to the memory array 500.

Control circuitry 570 decodes signals provided by control connections 572 from the processor 510. These signals can include chip signals, write enable signals, and address latch signals that are used to control the operations on the memory array 500, including data read, data write, and data erase operations. In one or more embodiments, the control circuitry 570 is responsible for executing instructions from the processor 510 to perform the operating embodiments of the present disclosure. The control circuitry 570 can be a state machine, a sequencer, or some other type of controller. It will be appreciated by those skilled in the art that additional circuitry and control signals can be provided, and that the memory device detail of FIG. 5 has been reduced to facilitate ease of illustration.

Figure 6:
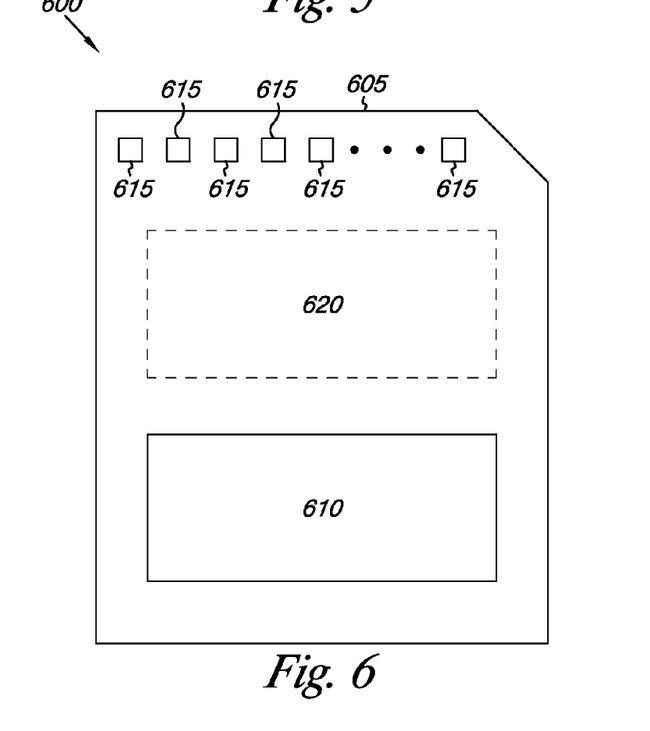
FIG. 6 is a functional block diagram of a memory module having at least one memory device in accordance with an embodiment of the present disclosure.

FIG. 6 is a functional block diagram of a memory module 600 including at least one non-volatile SRAM in accordance with one or more embodiments of the present disclosure. Memory module 600 is illustrated as a memory card, although the concepts discussed with reference to memory module 600 are applicable to other types of removable or portable memory (e.g., USB flash drives) and are intended to be within the scope of "memory module" as used herein. In addition, although one example form factor is depicted in FIG. 6, these concepts are applicable to other form factors as well.

In one or more embodiments, memory module 600 will include a housing 605 (as depicted) to enclose one or more memory devices 610, though such a housing is not essential to all devices or device applications. At least one memory device 610 includes a non-volatile SRAM that can be formed and operated according to one or more embodiments described herein. Where present, the housing 605 includes one or more contacts 615 for communication with a host device. Examples of host devices include digital cameras, digital recording and playback devices, PDAs, personal computers, memory card readers, interface hubs and the like. For one or more embodiments, the contacts 615 are in the form of a standardized interface. For example, with a USB flash drive, the contacts 615 might be in the form of a USB Type-A male connector. For one or more embodiments, the contacts 615 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 615 provide an interface for passing control, address and/or data signals between the memory module 600 and a host having compatible receptors for the contacts 615.

The memory module 600 may optionally include additional circuitry 620, which may be one or more integrated circuits and/or discrete components. For one or more embodiments, the additional circuitry 620 may include control circuitry, such as a memory controller, for controlling access across multiple memory devices 610 and/or for providing a translation layer between an external host and a memory device 610. For example, there may not be a one-to-one correspondence between the number of contacts 615 and a number of 610 connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC. Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

Methods, devices and systems for a non-volatile SRAM have thus been presented. One method embodiment for operating the SRAM includes transferring data from a pair of static storage nodes of the SRAM to a pair of non-volatile storage nodes when the SRAM is placed in a standby mode. The method further includes transferring data from the pair of non-volatile storage nodes to the pair of static storage nodes when the SRAM exits the standby mode.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A static random access memory (SRAM), comprising:
a cross coupled pair of inverters, wherein each inverter includes a p-type pull up transistor and an n-type pull down transistor coupled to a first static storage node, wherein gates of each inverter in the pair are coupled to the first static storage node of the other inverter; and
wherein each inverter includes a second non-volatile storage node coupled to the first static storage node, wherein the second storage node comprises a two terminal magnetic tunnel junction (MTJ) device, wherein the MTJ device includes:
 a first unpinned ferromagnetic layer coupled to the first storage node such that a polarization of an associated spin value can rotate; and
 a second pinned ferromagnetic layer in contact with an anti-ferromagnetic layer coupled to a control line such that a polarization of an associated spin value is fixed in one direction;
 wherein the first unpinned ferromagnetic layer and the second pinned ferromagnetic layer are separated by a dielectric.

2. The SRAM of claim 1, wherein the MTJ device can alternate between a first resistance and a second resistance according to spin value states in the first and the second ferromagnetic layers.

3. A method for operating a static random access memory (SRAM), comprising:
transferring data from a pair of static storage nodes of the SRAM to a pair of non-volatile storage nodes when the SRAM is placed in a standby mode; wherein the pair of non-volatile storage nodes comprise a pair of two terminal magnetic tunnel junction (MTJ) devices, and wherein the MTJ devices include:
 a first unpinned ferromagnetic layer coupled to the first storage node such that a polarization of an associated spin value can rotate; and
 a second pinned ferromagnetic layer in contact with an anti-ferromagnetic layer coupled to a control line such that a polarization of an associated spin value is fixed in one direction;
 wherein the first unpinned ferromagnetic layer and the second pinned ferromagnetic layer are separated by a dielectric; and
transferring data from the pair of non-volatile storage nodes to the pair of static storage nodes when the SRAM exits the standby mode;
wherein transferring data includes changing a potential applied to the pair of non-volatile storage nodes between a first potential and a second potential using a control circuit coupled by a control line to the pair of non-volatile storage nodes.

4. The method of claim 3, wherein the method includes utilizing spin torque transfer magnetization switching for transferring data between the pair of static storage nodes and the pair of non-volatile storage nodes.

5. A method for operating a static random access memory (SRAM), comprising:
applying a first potential to a pair of non-volatile storage nodes coupled to a pair of static storage nodes of the SRAM in order to store data from the pair of static storage nodes to the pair of non-volatile storage nodes; wherein the pair of non-volatile storages nodes comprise a pair of two terminal magnetic tunnel junction (MTJ) devices, and wherein the MJT devices include:
 a first unpinned ferromagnetic layer coupled to the first storage node such that a polarization of an associated spin value can rotate; and
 a second pinned ferromagnetic layer in contact with an anti-ferromagnetic layer coupled to a control line such that a polarization of an associated spin value is fixed in one direction;
 wherein the first unpinned ferromagnetic layer and the second pinned ferromagnetic layer are separated by a dielectric;
applying a second potential to the pair of non-volatile storage nodes to return data from the pair of non-volatile storage nodes to the pair of static storage nodes; and
applying a third potential to reset the pair of non-volatile storage nodes.

6. The method of claim 5, wherein:
applying the first potential includes applying a ground to the pair of non-volatile storage nodes;
applying the second potential includes applying a power supply potential; and
applying the third potential includes applying a potential which is higher in magnitude than the power supply potential.

7. The method of claim 6, wherein the method includes:
applying the first potential before powering down the SRAM;
applying the second potential before powering up the SRAM; and
applying the third potential after powering up the SRAM.

8. The method of claim 5, wherein the method includes coupling the second potential to the pair of non-volatile storage nodes for reading from and writing to the static storage nodes when the SRAM is powered up.

9. A method for forming a memory, comprising:
cross coupling a pair of inverters to form a static random access memory (SRAM) cell, each inverter including a p-type pull up transistor and an n-type pull down transistor coupled to a static storage node, wherein gates of each inverter in the pair are coupled to the static storage node of the other inverter; and
connecting a pair of non-volatile storage nodes to a pair of static storage nodes by forming the pair of non-volatile storage nodes above a layer in which the static storage nodes of the SRAM are formed to conserve SRAM cell area; wherein the pair of non-volatile storage nodes comprise a pair of two terminal magnetic tunnel junction (MTJ) devices, and wherein the MTJ devices include:
 a first unpinned ferromagnetic layer coupled to the first storage node such that a polarization of an associated spin value can rotate; and
 a second pinned ferromagnetic layer in contact with an anti-ferromagnetic layer coupled to a control line such that a polarization of an associated spin value is fixed in one direction;
 wherein the first unpinned ferromagnetic layer and the second pinned ferromagnetic layer are separated by a dielectric.

10. The method of claim 9, wherein the method includes connecting a control line to the pair of non-volatile storage nodes.

11. The method of claim 10, wherein connecting the pair of non-volatile storage nodes includes connecting the pair of MTJ devices such that the first ferromagnetic layer in each device is connected to the static storage node and the second ferromagnetic layer in each device is connected to the control line.

12. The method of claim 11, wherein the method includes connecting an anti-ferromagnetic layer between the second ferromagnetic layer and the control line to fix a polarization of an associated spin value of the second ferromagnetic layer in one direction.

13. The method of claim 12, wherein the method includes:

forming a number of SRAM cells in an array wherein each SRAM cell includes a complementary pair of sense lines coupled to a static storage node in each inverter; and wherein connecting the control line to the pair of non-volatile storage nodes includes connecting the control line to the pair of non-volatile storage nodes in a block of SRAM cells.

14. A method for operating a static random access memory (SRAM), comprising:

transferring data from a pair of static storage nodes of the SRAM to a pair of non-volatile storage nodes when the SRAM is placed in a standby mode by coupling a ground to the pair of non-volatile storage nodes; wherein the pair of non-volatile storage nodes comprise a pair of two terminal magnetic tunnel junction (MTJ) devices, and wherein the MTJ devices include:

a first unpinned ferromagnetic layer coupled to the first storage node such that a polarization of an associated spin value can rotate; and a second pinned ferromagnetic layer in contact with an anti-ferromagnetic layer coupled to a control line such that a polarization of an associated spin value is fixed in one direction;

wherein the first unpinned ferromagnetic layer and the second pinned ferromagnetic layer are separated by a dielectric; and transferring data from the pair of non-volatile storage nodes to the pair of static storage nodes when the SRAM exits the standby mode by coupling a first positive potential to the pair of non-volatile storage nodes.

15. The method of claim 14, wherein the method includes coupling a second positive potential that is higher in magnitude than the first positive potential to at least partially halt transferring data between to the pair of static storage nodes and the pair of non-volatile storage nodes.

16. The method of claim 15, wherein the method includes coupling the first positive potential to the pair of non-volatile storage nodes for reading from and writing to the static storage nodes when the SRAM is powered up.

* * * * *

UNITED STATES PATENT AND TRADEMARK OFFICE
CERTIFICATE OF CORRECTION

| | | |
|---|---|---|
| PATENT NO. | : 7,791,941 B2 | |
| APPLICATION NO. | : 11/924801 | |
| DATED | : September 7, 2010 | |
| INVENTOR(S) | : Hussein I. Hanafi | |

It is certified that error appears in the above-identified patent and that said Letters Patent is hereby corrected as shown below:

In column 11, line 5, in Claim 1, before "static" delete "first".

In column 11, line 7, in Claim 1, before "static" delete "first".

In column 11, line 7, in Claim 1, after "inverter;" delete "and".

In column 11, line 8, in Claim 1, delete "each inverter" and insert -- the SRAM --, therefor.

In column 11, line 8, in Claim 1, before "non-volatile" delete "second".

In column 11, line 9, in Claim 1, delete "first" and insert -- each --, therefor.

In column 11, line 10, in Claim 1, delete "second" and insert -- non-volatile --, therefor.

In column 11, line 13, in Claim 1, delete "the first" and insert -- the static --, therefor.

In column 11, line 14, in Claim 1, after "node" insert -- of a respective inverter --.

In column 11, line 23, in Claim 1, delete "dielectric." and insert -- dielectric; and
wherein the control line is coupled to each of the non-volatile storage nodes, and wherein:
a ground potential applied to the control line stores data from each static storage node to each
non-volatile storage node respectively;
a power supply potential applied to the control line returns data from each non-volatile storage node to
each static storage node respectively; and
a potential applied to the control line that is higher in magnitude than the power supply potential resets
each non-volatile storage node. --, therefor.

Signed and Sealed this
Twenty-fifth Day of January, 2011

David J. Kappos
*Director of the United States Patent and Trademark Office*

CERTIFICATE OF CORRECTION (continued)
U.S. Pat. No. 7,791,941 B2

In column 11, line 32, in Claim 3, delete "mode;" and
insert -- mode by applying a ground potential to the pair of non-volatile storage nodes using a control circuit coupled by a control line to the pair of non-volatile storage nodes; --, therefor.

In column 11, line 45, in Claim 3, after "dielectric;" delete "and".

In column 11, lines 49-54, in Claim 3, delete "mode;
wherein transferring data includes changing a potential applied to the pair of non-volatile storage nodes between a first potential and a second potential using a control circuit coupled by a control line to the pair of non-volatile storage nodes." and
insert -- mode by applying a power supply potential to the pair of non-volatile storage nodes using the control circuit; and
resetting the pair of non-volatile storage nodes by coupling a potential that is higher in magnitude than the power supply potential to the pair of non-volatile storage nodes using the control circuit. --, therefor.

In column 11, line 61, in Claim 5, delete "first" and insert -- ground --, therefor.

In column 11, line 65, in Claim 5, delete "storages" and insert -- storage --, therefor.

In column 11, line 67, in Claim 5, delete "MJT" and insert -- MTJ --, therefor.

In column 12, line 11, in Claim 5, delete "second" and insert -- power supply --, therefor.

In column 12, line 14, in Claim 5, before "potential" delete "third".

In column 12, line 14, in Claim 5, after "potential" insert -- that is higher in magnitude than the power supply potential --.

In column 12, line 24, in Claim 7, delete "claim 6," and insert -- claim 5, --, therefor.

In column 12, line 26, in Claim 7, delete "first" and insert -- ground --, therefor.

In column 12, line 28, in Claim 7, delete "second" and insert -- power supply --, therefor.

In column 12, line 30, in Claim 7, before "potential" delete "third".

In column 12, line 30, in Claim 7, after "potential" insert -- that is higher in magnitude than the power supply potential --.

In column 12, line 32, in Claim 8, delete "second" and insert -- power supply --, therefor.

In column 12, line 41, in Claim 9, after "inverter;" delete "and".

CERTIFICATE OF CORRECTION (continued)
U.S. Pat. No. 7,791,941 B2

In column 12, line 58, in Claim 9, delete "dielectric." and insert -- dielectric; and connecting the control line to the pair of non-volatile storage nodes, and wherein: a ground potential applied to the control line stores data from the pair of static storage nodes to the pair of non-volatile storage nodes; a power supply potential applied to the control line returns data from the pair of non-volatile storage nodes to the pair of static storage nodes; and a potential applied to the control line that is higher in magnitude than the power supply potential resets the pair of non-volatile storage nodes. --, therefor.

In column 12, line 62, in Claim 11, delete "claim 10," and insert -- claim 9, --, therefor.

In column 12, lines 63-64, in Claim 11, before "devices" delete "the pair of MTJ".

In column 14, line 10, in Claim 14, after "dielectric;" delete "and".

In column 14, line 14, in Claim 14, delete "nodes." and insert -- nodes; and resetting the pair of non-volatile storage nodes by coupling a second positive potential that is higher in magnitude than the first positive potential to the pair of nonvolatile storage nodes. --, therefor.

In column 14, line 15, in Claim 15, delete "the method" and insert -- resetting --, therefor.

In column 14, line 16, in Claim 15, delete "a" and insert -- the --, therefor.